United States Patent [19]
Barber et al.

[11] Patent Number: 5,314,837
[45] Date of Patent: May 24, 1994

[54] METHOD OF MAKING A REGISTRATION MARK ON A SEMICONDUCTOR

[75] Inventors: Herbert J. Barber, Winchendon; Pamela A. Mayernik, Peabody, both of Mass.

[73] Assignee: Analog Devices, Incorporated, Norwood, Mass.

[21] Appl. No.: 894,265

[22] Filed: Jun. 8, 1992

[51] Int. Cl.[5] ............................................. H01L 21/20
[52] U.S. Cl. ..................................... 437/89; 437/90; 437/228; 437/924; 437/944; 437/966; 148/DIG. 50; 148/DIG. 51; 148/DIG. 106; 257/797
[58] Field of Search ................... 437/89, 924, 944, 90, 437/228, 966; 257/797; 148/DIG. 50, DIG. 51, DIG. 106

[56] References Cited

U.S. PATENT DOCUMENTS

| | | | |
|---|---|---|---|
| 4,549,926 | 10/1985 | Corboy et al. | 437/89 |
| 4,558,508 | 12/1985 | Kinney et al. | 437/944 |
| 4,573,257 | 3/1986 | Hulseweh | 437/924 |
| 4,642,672 | 2/1987 | Kitakata | 257/797 |
| 4,698,316 | 10/1987 | Corboy et al. | 437/89 |
| 4,728,623 | 3/1988 | Lu et al. | 437/984 |
| 4,893,163 | 1/1990 | Rudeck | 257/797 |
| 4,936,930 | 1/1990 | Gruber et al. | 437/90 |
| 4,956,304 | 9/1990 | Cockrum et al. | 437/228 |
| 5,002,901 | 3/1991 | Kurtz et al. | 437/228 |
| 5,106,432 | 4/1992 | Matsumoto | 437/924 |
| 5,128,283 | 7/1992 | Tanaka | 437/924 |
| 5,155,061 | 10/1992 | O'Connor et al. | 437/966 |
| 5,196,368 | 3/1993 | Thompson et al. | 148/DIG. 106 |

Primary Examiner—Olik Chaudhuri
Assistant Examiner—Ramamohan Rao Paladugu
Attorney, Agent, or Firm—Parmelee, Bollinger & Bramblett

[57] ABSTRACT

The process of making a registration mark on an integrated-circuit substrate wherein photoimaging first is used to define an optically-recognizable mark on a predetermined position of the substrate, and the substrate then is covered with silicon dioxide. Photoresist then is applied over the substrate and selectively removed except over the mark. Etchant then is applied to remove all silicon dioxide except over the photoresist-covered mark. An epitaxial layer thereafter is grown over the substrate. The silicon dioxide over the mark prevents epitaxial growth in that region, so that the mark remains clear and optically visible for the rest of the IC processing.

12 Claims, 4 Drawing Sheets

METHOD OF MAKING A REGISTRATION MARK ON A SEMICONDUCTOR

BACKGROUND OF THE INVENTION

1. Field of the Invention

This invention relates to the processing of semiconductive substrates to form integrated circuit (IC) chips. More particularly, this invention relates to techniques for accurately aligning the substrates with the processing equipment.

2. Description of the Prior Art

Prior art processes use optically-recognizable registration marks formed on semiconductive wafer substrates to effect alignment of the substrates with the processing equipment, such as wafer steppers. Commonly, a so-called registration mask was used at the beginning of the process to form one or more marks on each wafer. Difficulty was frequently encountered, however, because the optical appearance of the mark became altered by the epitaxial layer subsequently grown as part of the IC processing. Such alteration (sometimes referred to as "epitaxial wash-out") obscured the mark, or distorted its apparent position. In any event, the result was increased number of IC chip rejects.

SUMMARY OF THE INVENTION

In one preferred embodiment of the invention, to be described hereinbelow in detail, such problems with prior art processes are avoided or significantly minimized by a new procedure for developing a registration mark. In this procedure, the semiconductive wafer first is formed with a layer of thermal oxide (silicon dioxide) and then covered with photoresist to be imaged. The photo imaging makes openings in the photoresist both for developing the required transistor buried layers in the substrate, and also for locating and defining registration marks. The registration mark openings are formed in a manner to provide for developing a distinctive optical appearance identifying corresponding locations on the wafer.

Buffered oxide etchant then is applied through the photoresist openings to remove oxide in the regions beneath the openings. The etchant removes the oxide beneath the registration openings in the photoresist in such a manner as to develop optically-identifiable features identifying the chosen locations. The remainder of the photoresist then is removed.

Dopant then is deposited in the regions to be formed with buried layers. This dopant is driven-in, using conventional techniques.

A further layer of silicon dioxide then is grown over the entire wafer during drive-in of the buried layer. Above the selected locations where the already-formed registration marks were made, this second layer of silicon dioxide presents an optically-recognizable characteristic (a difference in oxide height) representing the distinctive optical appearance of the previously-formed optically-identifiable features for the registration mark in the initial layer of oxide.

A further layer of photoresist then is applied and imaged to provide for its removal in all regions except above the locations where the registration mark openings had been made in the initial layer of oxide. The silicon dioxide then is etched away in the photoresist-free regions, leaving the photoresist-covered segment of silicon dioxide over the registration mark location.

When the photoresist over that segment is removed, the segment presents an optically-recognizable mark derived from the distinctive optical appearance of the originally-formed registration mark.

When the epitaxial layer ultimately is grown on the substrate, it will not extend over the silicon dioxide segment presenting the registration mark. This is because silicon dioxide is an epitaxial-resistant material. Thus, the mark will still be clearly presented after the epitaxial layer is grown, and during all of the processing following such growth of the epitaxial layer.

Other objects, aspects and advantages of the invention will in part be pointed out in, and in part apparent from, the following description of a preferred embodiment of the invention, considered together with the accompanying drawings.

DETAILED DESCRIPTION OF A PREFERRED EMBODIMENT

Figure 1:
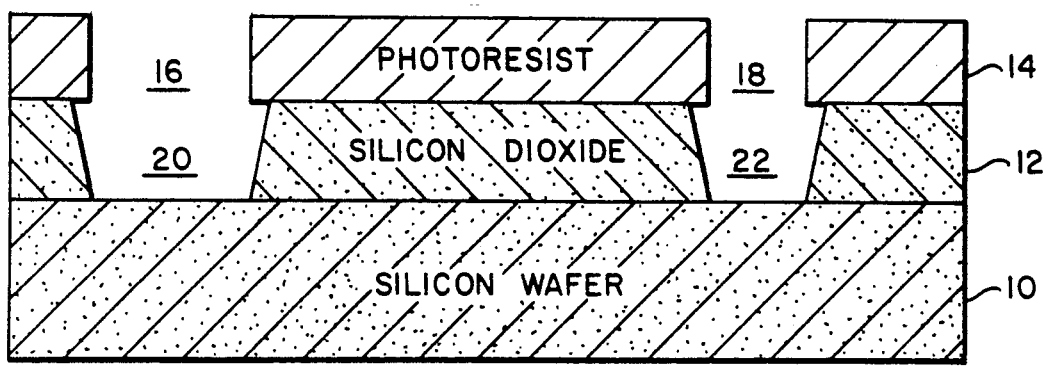
FIG. 1 is a sectional view of a wafer illustrating the etched initial layer of oxide.

Referring first to FIG. 1, there is shown a silicon wafer 10 which has received a layer of thermal oxide 12 covered by photoresist 14. The photoresist is exposed through a mask (not shown) to form openings 16 where dopant is to be deposited to form the usual buried layers for the transistors of each integrated circuit chip. Also formed are photoresist openings such as illustrated at 18 defining registration marks to be formed subsequently. (The opening at 18 is shown in somewhat simplified form to illustrate the basic concept, but may in actuality be a complex set of openings in the photoresist defining a geometric pattern as seen from above, such as a central bar-shaped opening surrounded by radial bar-shaped openings.)

The wafer then is etched, e.g., with buffered oxide etch (BOE), to form corresponding openings 20 and 22 in the thermal oxide 12. The left-hand opening 20 represents the regions opened for depositing the dopant for the buried layers to be formed for the transistors of the IC. The opening at 22 represents the etched registration mark which, as noted above, may be a complex geometric pattern.

The photoresist then is removed, and the dopant for the buried layer is deposited through the left-hand openings 20. Thereafter, the dopant is driven-in by conventional processes to the required depth in the wafer.

Figure 2:
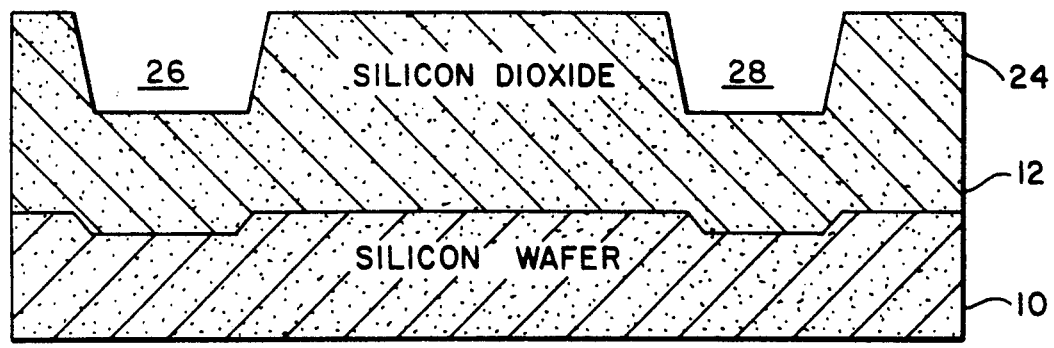
FIG. 2 is a sectional view illustrating application of a layer of silicon dioxide over the initial oxide layer.

During the buried-layer drive, a surplus of about 2500 Å of thermal oxide 24 is grown over the initial layer of thermal oxide 12 and the exposed openings 20, 22. The result, as illustrated in FIG. 2, is that the layer 24 is formed with one recess 26 (actually, a number of such recesses), corresponding to the buried layer opening 20, and another recess 28 corresponding to the opening 22 for the alignment target (i.e., a selected element of the registration mark).

Figure 3:
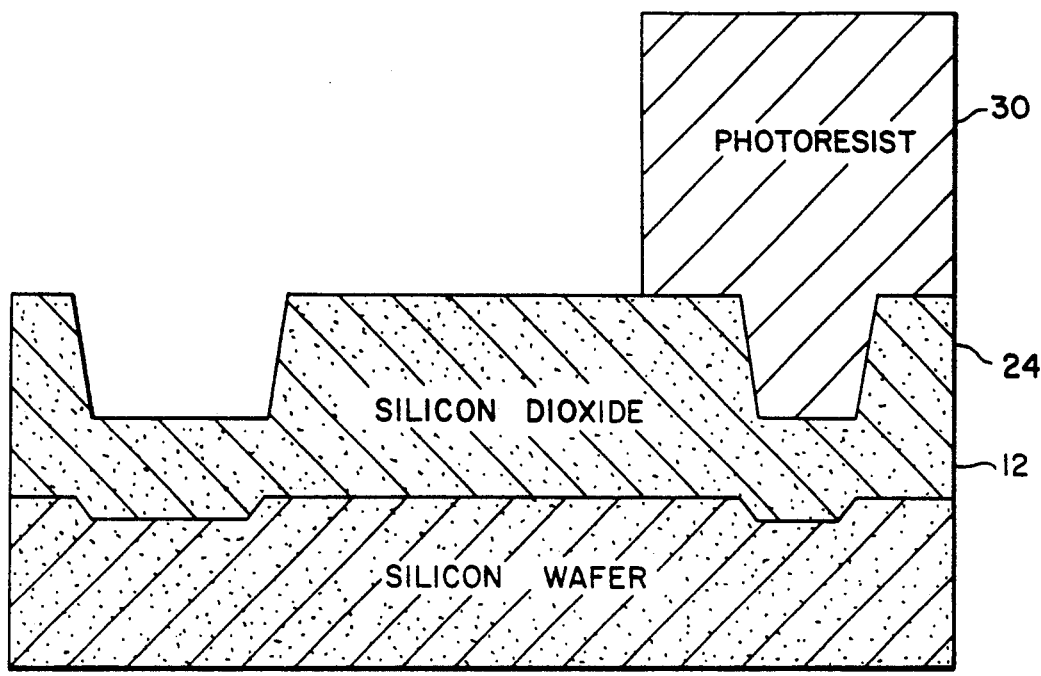
FIG. 3 is a sectional view showing photoresist over the region where the registration mark is located.
Figure 4:
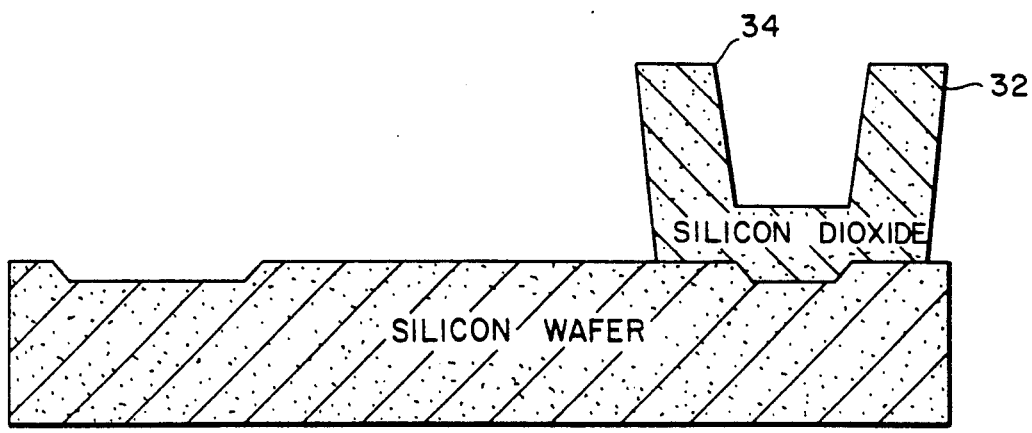
FIG. 4 is a sectional view showing the segment of silicon dioxide representing the registration mark.

Photoresist then is applied and imaged in such a way that resist 30 covers the registration mark region, as shown in FIG. 3. The thermal oxide then is etched away except for that portion 32 beneath the resist 26. Removal of that resist material leaves only the silicon dioxide segment 32 as shown in FIG. 4, to provide protection for the mark which is represented, in the illustrated embodiment, by the contour of the upper surface of the segment 32. One or more places (e.g., inner edge 34) on that contour can be selected as the alignment target of the mark region, to provide for alignment with the processing apparatus.

Figure 5:
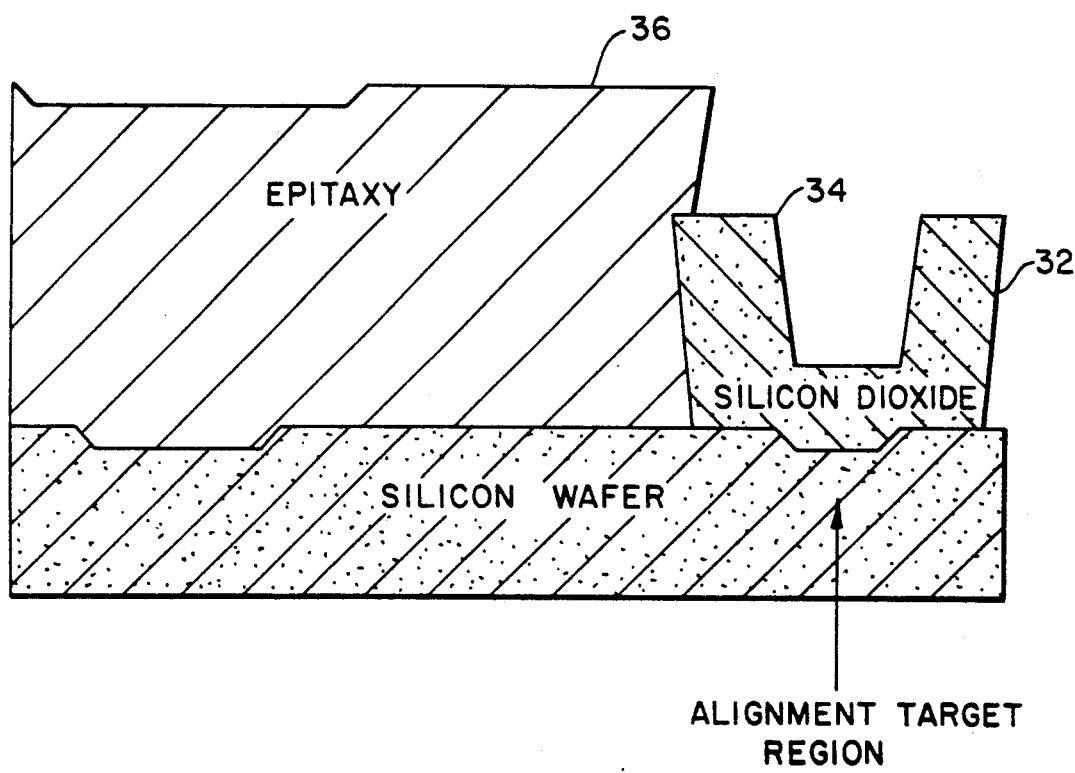
FIG. 5 shows the epitaxial layer grown in regions other than that of the silicon dioxide segment of FIG. 4.

When the epitaxial material 36 subsequently is grown over the wafer substrate (see FIG. 5), it will not grow over the protective segment 32. This is because that segment, carrying the registration mark information, is formed of epitaxial-resistant material. That is, silicon dioxide resists crystalline growth of the epitaxial material. More particularly, silicon dioxide does not provide a stoichiometric lattice match with the epitaxial material. Thus, the registration mark alignment target edge 34 remains exposed after the epitaxial layer has been grown, and continues to serve its registration function during the remainder of the processing. Use of an inner part of the registration mark (e.g., the inner edge 34) as the alignment focus of the target avoids the possibility that the abutting epitaxial material 36 can abrade the target and alter its location.

There are materials other than silicon dioxide which also are epitaxial-resistant, and which may in some circumstances be used with advantage. For example, silicon nitride has such epitaxial-resistant quality.

Figure 6:
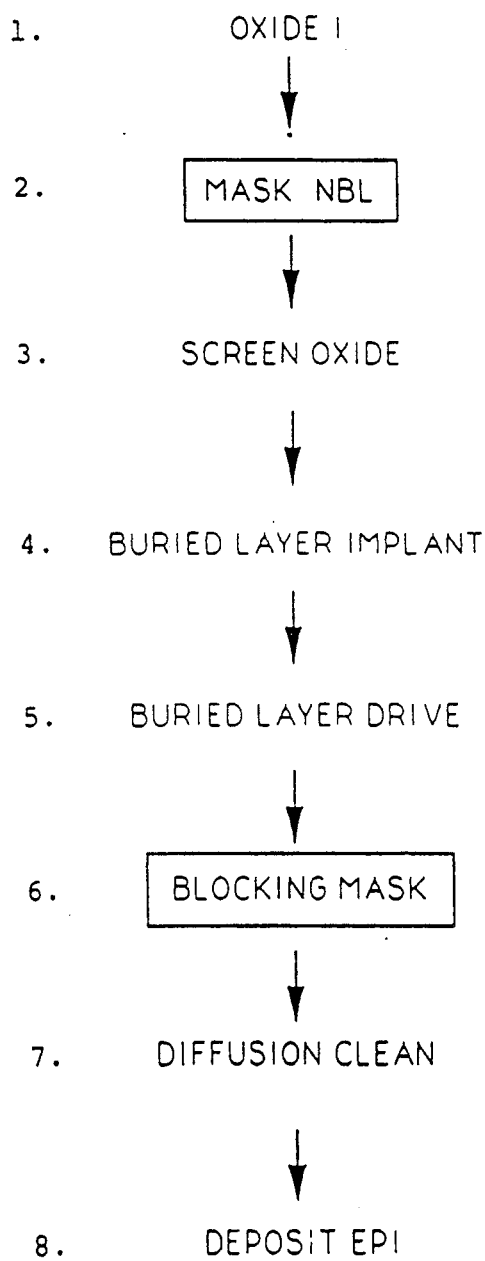
FIG. 6 is a flow diagram identifying the sequential stages of the registration mark process.

FIG. 6 presents a flow diagram outlining the procedural steps described above. The second numbered step (Mask NBL) refers to the usual mask for implantation of N-type buried layer dopant. The "Blocking Mask" of the sixth numbered step develops the photoresist pattern (see FIG. 3) for the silicon dioxide segment 32 (FIG. 4).

The registration mark process may be used to produce only a single registration mark for each wafer, for example where the IC processing uses a one-times scanner. More commonly, the process will produce a number of marks on each wafer, one for each "field" (where a large number of IC transistors are to be formed), so that alignment can be effected with multiple wafer steppers.

Although one particular type of mark has been described, there are many ways to develop a distinctive optical characteristic for alignment purposes. For example, various mark outlines can be used. The pattern formed in the photoresist for the mark also can be reversed, i.e., so that openings and solid material are interchanged, as compared with the mark described herein. Still other kinds of marks can be utilized, such as effecting controlled damage to the surface of the semiconductive substrate, as by ion implantation.

The silicon dioxide segment 32 serves to present an optically-recognizable mark representing a distinctive characteristic of the mark as formed in the initial layer of thermal oxide 12. Thus, the silicon dioxide segment 32 facilitates optical observation of the mark. It does this by physically developing at its upper surface an optically-recognizable replica or "repeat" of the mark formed in the initial thermal oxide layer. Still other techniques than physical replication could be used, for example, by use of an epitaxial-resistant material which is sufficiently optically transparent to permit direct optical observation of an initially-formed mark at a lower level, i.e., beneath the epitaxial-resistant material.

Accordingly, it is to be understood that although a preferred embodiment of the invention has been disclosed herein in detail, this has been for the purpose of illustrating the invention, and should not be construed as necessarily limiting the scope of the invention since it is apparent that many changes can be made by those skilled in the art while still practicing the invention claimed herein.

What is claimed is:

1. For making a registration mark on a semiconductive substrate to be used for alignment purposes during integrated-circuit processing of the substrate, the method comprising the steps of:
   developing a distinctive characteristic defining a particular location on said substrate;
   placing over said substrate at said location an epitaxial-resistant material serving to present an optically-recognizable mark representing said distinctive characteristic so as to identify said location; and
   growing on said substrate an epitaxial layer the growth of which is prevented at said location by said epitaxial-resistant material.

2. The method of claim 1, wherein said epitaxial-resistant material is silicon dioxide.

3. The method of claim 1, wherein said distinctive characteristic is optically-recognizable and is produced by the process including the steps of:
   developing a layer of insulating material on said substrate;
   covering said insulating material with photoresist material; and
   imaging said photoresist material to produce a distinctive pattern of openings therein.

4. The method of claim 3, wherein said substrate is silicon and said material is silicon dioxide.

5. The method of claim 4, wherein said silicon dioxide is etched through said photoresist to establish said pattern in the silicon dioxide; and
   growing a further layer of silicon dioxide over the first layer, to present a mark corresponding to said pattern.

6. For making a registration mark on a semiconductive substrate to be used for alignment purposes during the integrated-circuit processing of said substrate, the method comprising the steps of:
   developing a layer of insulative material on said substrate;
   forming said insulative material in one location to define a registration mark;
   applying over said insulative material a layer of epitaxial-resistant material facilitating optical observation of said mark;
   removing said insulative material and said epitaxial-resistant material from regions of said substrate other than in said one location; and
   growing on said substrate an epitaxial layer which is non-adherent to said epitaxial-resistant material at said location.

7. The method of claim 6, wherein said substrate is silicon and said insulative material is silicon dioxide.

8. The method of claim 7, wherein said silicon dioxide is thermally grown on said silicon substrate.

9. The method of claim 6, wherein said optical observation of said mark on said insulative material is facilitated by the physical development at a surface of said epitaxial-resistant material of a replica of said mark.

10. The method of claim 9, wherein said mark is defined at an inner region of said epitaxial-resistant material away from contact with said epitaxial layer.

11. The method of claim 6, wherein said insulative material is a layer of silicon dioxide and said epitaxial-resistant material is a further layer of silicon dioxide.

12. The method of claim 6, wherein said registration mark is developed by characterizing the contour of the upper surface of said layer of insulation material; and
    said epitaxial-resistant material being formed so as to at least approximately follow the contour of the upper surface said registration mark to serve as a replica of said mark.

* * * * *